United States Patent
Kawakita et al.

[11] Patent Number: 5,977,490
[45] Date of Patent: Nov. 2, 1999

[54] CONDUCTIVE PASTE COMPOUND FOR VIA HOLE FILLING, PRINTED CIRCUIT BOARD WHICH USES THE CONDUCTIVE PASTE, AND METHOD OF MANUFACTURING THE SAME

[75] Inventors: Kouji Kawakita, Joyo; Seiichi Nakatani, Hirakata; Tatsuo Ogawa, Amagasaki; Masatoshi Suehiro, Kyoto; Kouichi Iwaisako, Uji; Hideo Akiyama, Kyoto, all of Japan

[73] Assignees: Matsushita Electric Industrial Co., Ltd.; Dai-Ichi Kogyo Seiyaku Co. Ltd.; Dowa Mining Co., Ltd., all of, Japan

[21] Appl. No.: 08/780,329

[22] Filed: Jan. 8, 1997

Related U.S. Application Data

[62] Division of application No. 08/649,189, May 17, 1996, which is a continuation of application No. 08/424,962, Apr. 19, 1995, abandoned, which is a division of application No. 08/330,733, Oct. 28, 1994, Pat. No. 5,652,042.

[30] Foreign Application Priority Data

Oct. 29, 1993 [JP] Japan ................................ 5-272618
Oct. 29, 1993 [JP] Japan ................................ 5-272619

[51] Int. Cl.$^6$ ............................ H05K 1/11; C08K 3/08
[52] U.S. Cl. .................... 174/265; 174/255; 174/257; 174/259; 524/440; 252/514
[58] Field of Search ................... 174/255, 257, 174/259, 265; 524/440

[56] References Cited

U.S. PATENT DOCUMENTS

| | | | |
|---|---|---|---|
| 3,983,075 | 9/1976 | Marshall | 523/459 |
| 4,383,363 | 5/1983 | Hayakawa | 29/847 |
| 4,598,037 | 7/1986 | Felten | 430/330 |
| 4,634,623 | 1/1987 | Watkins | 428/208 |
| 4,937,148 | 6/1990 | Sato | 423/618 |
| 4,967,314 | 10/1990 | Higgins, III | 361/792 |
| 5,043,102 | 8/1991 | Chen et al. | 252/514 |
| 5,242,511 | 9/1993 | Yokoyama | 148/430 |
| 5,326,636 | 7/1994 | Durand | 428/323 |
| 5,346,750 | 9/1994 | Hatakeyama | 428/209 |
| 5,440,075 | 8/1995 | Kawakita et al. | 174/265 |

FOREIGN PATENT DOCUMENTS

| | | |
|---|---|---|
| 279 979 | 8/1988 | European Pat. Off. . |
| 41 25 879 | 2/1992 | Germany . |
| 5175650 | 10/1993 | Japan . |
| 974919 | 11/1964 | United Kingdom . |

OTHER PUBLICATIONS

A.K. Cousens et al., Microelectronics Journal, "Polymer Thick Film Systems and Surface Mount Techniques," vol. 18, No. 3, May/Jun. 1987, pp. 22–40.

*Primary Examiner*—Tae Yoon
*Attorney, Agent, or Firm*—Morrison & Foerster, LLP

[57] ABSTRACT

A conductive paste compound for via hole filling includes a conductive filler at 80 to 92 weight percent with an average particle size of from 0.5 to 20 μm and specific surface of from 0.1 to 1.5 m$^2$/g, a liquid epoxy resin at 4.5 to 20 weight percent containing 2 or more epoxy groups with room temperature viscosity of 15 Pa.sec or less, and a hardener at 0.5 to 5 weight percent, wherein the viscosity is 2,000 Pa.sec or less and the volatile amount is 2.0 weight percent or less. A filling paste and a printed circuit board with use thereof are provided which can conduct an inner-via-hole connection between electrode layers without using a through-hole plating technique.

The conductive paste comprises a metallic particle such as copper, an epoxy resin, a hardener, and if necessary, a dispersant. The paste having low viscosity and low volatility under high shear is used to fill holes disposed in a laminated substrate. Then, this substrate is heated and pressurized together with copper foil on both sides to attain a printed circuit board where both sides are electrically inner-via-hole connected.

4 Claims, 7 Drawing Sheets

CONDUCTIVE PASTE COMPOUND FOR VIA HOLE FILLING, PRINTED CIRCUIT BOARD WHICH USES THE CONDUCTIVE PASTE, AND METHOD OF MANUFACTURING THE SAME

This application is a division of Ser. No. 08/649,189, filed May 17, 1996, which is a continuation of Ser. No. 08/424,962, filed Apr. 19, 1995, now abandoned, which is a division of Ser. No. 08/330,733, filed Oct. 28, 1994, now U.S. Pat. No. 5,652,042.

FIELD OF THE INVENTION

This invention relates to a conductive paste compound used for filling via holes and further relates to a double sided printed circuit board and a multilayer printed circuit board which uses the conductive paste.

BACKGROUND OF THE INVENTION

Recently, following the tendency of electronic devices towards high performance and compact size, a circuit board is required to have a high degree of lamination and high density. As a method of connecting layers within a substrate which can bond integrated circuits (IC) and components at the shortest distance, it is well-known that higher density can be attained through an inner-via-hole connection. In the case of a through-hole connection employed for a typical glass epoxy multilayer substrate, the connection is achieved by plating through-holes so that it was difficult to connect only the necessary layers. In addition, since the substrate comprises a top layer having an electrode land, this part can not be used to construct an electrode land of a surface mounting part. Therefore, due to these restrictions, the mounting density can not be easily enhanced.

In order to solve these problems, methods other than using through-holes are employed, for example, a method of reducing through-holes by disposing holes halfway in a substrate, or a method of improving mounting density by filling conductive paste in through-holes and by further closing up holes disposed in the top layer of a substrate at a plating step. However, due to the complicated manufacturing processes, the above-mentioned methods have cost and quantity production problems. On the other hand, simply the necessary layers can be connected in the inner-via-hole connection, and since there is no through-holes in the top layer of the substrate, the mounting property is also excellent.

When this connecting method is applied to a resin substrate, e.g. to a glass epoxy substrate, a double sided substrate establishes continuity by filling up through-holes with low-viscous solvent-type silver paste by means of a printing method and then dried and hardened. However, the specific resistance value of this connection is as high as about $10^{-3}$ Ω·cm, and the reliability in heat and shock resistance such as in the heat cycle is poor.

In order to reduce the viscosity of conductive paste, conventional methods employed were to use large particles for reducing the amount of conductive filler or specific surface area, or to add a solvent with a low boiling point or a reactant type diluent.

However, when an additive amount of conductive filler was reduced, or when large particles were used, the problem occurred that contact points between fillers decreased and the resistance value of a via-hole-connection became so high that reliability could not be maintained in a test where thermal stress occurs, e.g., in the heat cycle test.

With use of the method in which a solvent with a low boiling point or a reactant type diluent was added, these components volatilized and decreased enormously in weight while being hardened through heat-pressing. Due to these volatile components, the base material either swelled or lost peel strength to the copper foils of the wiring.

Furthermore, when a dispersant was not added, it was a problem that particle forms were limited to reduce viscosity, and that a printed filling of via holes was difficult even with use of those which are rather low in viscosity since the viscosity raised under high shear during the printing process.

SUMMARY OF THE INVENTION

An object of this invention is to solve the above-noted problems by providing a conductive paste compound having low viscosity and low volatility which can achieve an electrical connection and heat and shock resistance between electrode layers through an inner-via-hole connection. Another object of this invention is to provide a double sided printed circuit board up to a multilayer printed circuit board including inner-via-hole connections using this paste.

In order to accomplish these and other objects and advantages, a conductive paste compound used for filling via holes of this invention comprises (a) a conductive filler in an amount of 80 to 92 weight percent, having an average particle size of 0.5 to 20 μm and a specific surface area of 0.1 to 1.5 m$^2$/g, (b) a liquid epoxy resin in an amount of 4.5 to 20 weight percent, containing two or more epoxy groups and having a room temperature viscosity of 15 Pa.sec or less, and (c) a hardener in an amount of 0.5 to 5 weight percent, wherein the viscosity of the conductive paste compound is 2,000 Pa.sec or less and the amount of volatile components is 2.0 weight percent or less.

It is preferable that the conductive paste compound used for filling via holes further comprises a dispersant at 0.01 to 1.5 weight percent against 100 weight parts of the components (a) to (c).

Furthermore, it is preferable that the conductive filler comprises at least one fine grain selected from the group consisting of gold, silver, palladium, copper, nickel, tin, and lead. It is preferable that the fine grain has a diameter of from 0.5 to 20 μm.

It is also preferable that the conductive filler comprises copper with a surface oxygen concentration of 1.0 weight percent or less.

In addition, it is preferable that the epoxy resin comprises at least one-component liquid epoxy resin selected from the group consisting of bisphenol A epoxy resin, bisphenol F epoxy resin, alicylic epoxy resin, amine epoxy resin, and glycidyl esterificated epoxy resin.

It is preferable that the liquid epoxy resin comprises 10 weight percent or more of an epoxy resin composed of glycidyl esterificated dimer acids.

Furthermore, it is preferable that the liquid epoxy resin is a compound comprising at least 50 weight percent or less of one epoxy resin selected from the group consisting of bisphenol A and bisphenol F, and further comprising 50 weight percent or more of epoxy resin composed of glycidyl esterificated dimer acids with an epoxy equivalent of from 300 to 600 (g/eq).

It is also preferable that the hardener is at least one hardener selected from the group consisting of amine hardeners such as dicyandiamide and carboxylic acid hydrazide, urea hardeners such as 3-(3,4-dichlorophenyl)-1,1-dimethyl urea, acid anhydride hardeners such as phthalic acid anhydride, methynadic anhydride, phromellitic acid anhydride, hexahydro phthalic acid anhydride, and aromatic amine (amine adduct) hardeners such as diamide diphenylmethane, diamide diphenylsulfonic acid.

In addition, it is preferable that the hardener comprises a subclinical hardener.

It is preferable that the dispersant comprises at least one dispersant selected from the group consisting of nonionic dispersants, e.g., ethylene oxide of higher fatty acid, propylene oxide addition esther compound, sorbitan fatty acid ester compound, ethylene oxide of polyhydric alcohol such as sorbitan, propylene oxide addition ether compound, ethylene oxide of alkylbenzene, propylene oxide additive, anionic dispersants, e.g., alkylbenzene sulfonic acid alkali salt, higher alcohol sulfate alkali salt, phosphate compound, higher fatty acid, ethylene oxide of higher fatty acid, propylene oxide additive such as sulfate alkali salt, and a fourth class ammonium salt type cationic dispersant.

Next, a double sided printed circuit board of this invention comprises an insulating base material disposed with inner via holes which are filled with a conductive resin compound comprising a conductive filler in an amount of 80 to 92 weight percent and having an average particle size of 0.5 to 20 $\mu$m and a specific surface area of 0.1 to 1.5 $m^2/g$, and further comprising epoxy resin with an epoxy ring-opening in an amount of 4.5 to 20 weight percent, wherein the upper and lower electrode layers on the surface of the insulating base material are electrically connected.

It is preferable that the insulating base material comprises a composite material of an aramid fiber and a thermosetting resin.

Furthermore, it is preferable that the insulating base material comprises a composite material of an aramid nonwoven fabric and an epoxy resin.

Next, a multilayer printed circuit board of this invention comprises a plurality of insulating base material layers and two or more electrode layers, wherein each insulating base material is disposed with inner via holes filled with a conductive resin compound comprising a conductive filler in an amount of 80 to 92 weight percent and having an average particle size of 0.5 to 20 $\mu$m and a specific surface area of 0.1 to 1.5 $m^2/g$, and further comprising an epoxy resin having an epoxy ring-opening in an amount of 4.5 to 20 weight percent, wherein each electrode layer is electrically connected.

It is preferable that the insulating base material comprises a composite material of an aramid fiber and a thermosetting resin.

Furthermore, it is preferable that the insulating base material comprises a composite material of an aramid nonwoven fabric and an epoxy resin.

A method of manufacturing a double sided printed circuit board of this invention comprises the steps of: disposing a prepreg used for manufacturing a printed circuit board with via holes in advance, filling the via holes with a conductive paste compound comprising (a) a conductive filler in an amount of 80 to 92 weight percent having an average particle size of 0.5 to 20 $\mu$m and a specific surface area of 0.1 to 1.5 $m^2/g$, (b) a liquid epoxy resin in an amount of 4.5 to 20 weight percent containing two or more epoxy groups and a room temperature viscosity of 15 Pa.sec or less, and (c) a hardener in an amount of 0.5 to 5 weight percent, wherein the conductive paste compound has a viscosity of 2,000 Pa.sec or less and the amount of volatile component is 2.0 weight percent or less, placing the prepreg between copper foils on the upper and lower layers and providing heat and pressurization, and forming circuits by etching the copper foils.

It is preferable that the prepreg comprises a composite material of an aramid fiber and a thermosetting resin.

Furthermore, it is preferable that the prepreg comprises a sheet composed of an aramid nonwoven fabric impregnated with a thermosetting epoxy resin.

A first method of manufacturing a multilayer printed circuit board of this invention comprises the steps of: disposing a prepreg used for manufacturing a printed circuit board with via holes in advance, filling the via holes with a conductive paste compound comprising (a) a conductive filler in an amount of 80 to 92 weight percent having an average particle size of 0.5 to 20 $\mu$m and a specific surface area of 0.1 to 1.5 $m^2/g$, (b) a liquid epoxy resin in an amount of 4.5 to 20 weight percent containing two or more epoxy groups and having a room temperature viscosity of 15 Pa.sec or less, and (c) a hardener in an amount of 0.5 to 5 weight percent, wherein the viscosity is 2,000 Pa.sec or less and the amount of volatile component is 2.0 weight percent or less, positioning the prepreg above and below a double sided printed circuit board, placing the prepregs between copper foils on the top layers, providing heat and pressurization, and etching the copper foils.

It is preferable that the prepreg comprises a composite material of an aramid fiber and a thermosetting resin.

Furthermore, it is preferable that the prepreg comprises a sheet composed of an aramid nonwoven fabric impregnated with a thermosetting epoxy resin.

A second method of manufacturing a multilayer printed circuit board of this invention comprises the steps of: disposing a prepreg used for manufacturing a printed circuit board with via holes in advance, filling the via holes with a conductive paste compound comprising (a) a conductive filler in an amount of 80 to 92 weight percent having an average particle size of 0.5 to 20 $\mu$m and a specific surface area of 0.1 to 1.5 $m^2/g$, (b) a liquid epoxy resin in an amount of 4.5 to 20 weight percent and containing two or more epoxy groups and having a room temperature viscosity of 15 Pa.sec or less, and (c) a hardener in an amount of 0.5 to 5 weight percent, wherein the conductive paste has a viscosity of 2,000 Pa.sec or less and an amount of volatile component is 2.0 weight percent or less, positioning the prepreg above and below a double sided printed circuit board, providing heat and pressurization, and forming circuits.

It is preferable that the prepreg comprises a composite material of an aramid fiber and a thermosetting resin.

Furthermore, it is preferable that the prepreg comprises a sheet composed of an aramid nonwoven fabric impregnated with a thermosetting epoxy resin.

According to the embodiments of this invention, a non-solvent one-component conductive compound can be obtained by dispersing a specific conductive filler within an epoxy resin having specific characteristics. Furthermore, by filling via holes with this conductive compound, a double sided printed circuit board and a multilayer printed circuit board can be obtained which have a highly reliable via-hole-connection.

First, the conductive filler will be explained. The conductive filler should preferably be contained in the conductive compound in high concentration. The reason for this is that, as mentioned above, conductive reliability must be maintained by raising the contact probability of the conductive fillers to each other even if the substrates are distorted due to lower resistance of connected via holes or due to thermal and mechanical stress.

In order to disperse the conductive filler with high concentration, the average particle size of the conductive filler should be preferably from 0.2 to 20 µm, and should also have as small a specific surface are as possible. A preferred value for the specific surface is from 0.1 to 1.5 $m^2/g$, and more preferably, from 0.1 to 1.0 $m^2/g$. The average diameter can be measured by using a microscopic method or a light scattering method. Noble metals such as gold, silver, and palladium, or base metals such as copper, nickel, tin, and lead are illustrative examples of the conductive fillers, and it is also possible to use two different kinds or more of these metals simultaneously. As long as the conductive filler has the characteristics mentioned above, it can be a spherical shape or a flaked form etc.

It is especially desirable to use copper powder as the conductive filler in view of migration control, economic supply, and price stability. But in general, copper powder is easily oxidized, and this oxidation of copper powder obstructs conductivity when it is used for filling via holes in this invention. Therefore, the oxygen concentration of the copper powder is preferably 1.0 weight % or less.

Next, an epoxy resin of specific characteristics will be explained. In order to form a non-solvent one-component conductive compound, it is basically necessary to use a liquid resin as the epoxy resin. For the dispersion of the above-mentioned conductive filler in high concentration, viscosity of the epoxy resin must be 15 Pa.sec or less. If an epoxy resin with viscosity higher than this value is used, viscosity of the conductive compound formed into paste becomes extremely high. This causes an inconvenience in that a via hole filling process can not take place when the paste viscosity of the conductive compound is 2,000 Pa.sec or higher. In addition, a preferred lower limit in viscosity of the epoxy resin is 0.2 Pa.sec.

On the other hand, when this compound is heat-compressed after being filled into the via holes, a volatile constituent in this compound should preferably be controlled to prevent the volatile constituent from vaporizing and causing voids within the via hole filling structure or to prevent the prepreg from separating. The volatile amount is preferably as small as possible, and the above-noted problems can be avoided when the amount is 2.0 weight % or less.

Examples of suitable epoxy resins are liquid epoxy resins including two or more epoxy radicals, for example, bisphenol A-type epoxy resin, bisphenol F-type epoxy resin, alicyclic epoxy resin, and amine epoxy resin. It is also possible to use liquid epoxy resin which are processed by molecular distillation to reduce the volatile amount.

Above all, an epoxy resin composed of glycidyl esterificated dimer acids has low viscosity (e.g., 0.2 to 0.9 Pa.sec). Also, a hardened substance of this epoxy resin shows flexibility, and its relaxation effect against stress is large. Therefore, when this epoxy resin is blended within the epoxy resin at 10 weight part or more, reliability of the via hole structure becomes higher.

Here, it is preferable that the liquid epoxy resin is a compound comprising at least 50 weigh % or less of one epoxy resin selected from the group consisting of bisphenol A and bisphenol F, and further comprising 50 weight % or more of epoxy resin composed of glycidyl esterificated dimer acids with an epoxy equivalent of from 300 to 600 g/eq. As a result, reliability of the via hole structure becomes higher in which the epoxy resin has lower viscosity, the hardened substance shows flexibility, and the relaxation effect against stress is large.

With regard to hardeners, any ordinary hardener can be used here. Generally used hardeners include amine-type hardeners such as dicyandiamide and carboxylic acid hydrazide, urea-type hardeners such as 3-(3,4-dichlorophenyl)-1,1-dimethyl urea, acid anhydride hardeners such as phthalic acid anhydride, methynadic anhydride, phromellitic acid anhydride, hexahydro phthalic acid anhydride, and aromatic amine-type (amine adduct) hardeners such as diamide diphenylmethane, diamide diphenylsulfonic acid. Above all, it is preferable to use a solid-type subclinical hardener, particularly in view of stability and workability of the compound. The solid-type subclinical hardener functions as follows. First, several kinds of amine component and epoxy resin are reacted to some degree, grained as resin particles, and reactive radicals such as amine are shut up in a three-dimensional structure of polymer. When this is blended with an epoxy resin, the particles react partially on the surface. However, the reaction stops at this point, and they can be preserved at room temperature for a long time without changing the characteristics. Then, the particles start to melt or dissolve when heated at a temperature higher than predetermined, and the shut-up reactive radicals show up and start to react all at once, thereby hardening quickly.

As for dispersants, any ordinary dispersant can be used. First, generally used dispersants include nonionic dispersants such as ethylene oxide of higher fatty acid, propylene oxide addition ester compound, sorbitan fatty acid ester compound, ethylene oxide of polyhydric alcohol such as sorbitan, propylene oxide addition ether compound, ethylene oxide of alkylbenzene, propylene oxide additive etc. Secondly, anionic dispersants, e.g., alkylbenzene sulfonic acid alkali salt, higher alcohol sulfuric ester alkali salt, phosphate compound, higher fatty acid, ethylene oxide of higher fatty acid, and sulfate alkali salt with propylene oxide additive can be used. Thirdly, a fourth class ammonium salt type cationic dispersant can be used.

In this instance, the dispersant is effective in reducing viscosity of the paste and adding fluidity to the metallic particles when shear is provided through increasing affinity between the metallic particle surface and an organic resin blended as binder in the paste. This function is seen in that the paste viscosity does not increase even under high shear in a screen printing process, and the paste can be filled easily into via holes disposed on a substrate.

With regard to the prepreg, almost any substance can be used which is pressed to become thinner than the prepreg when hardened, e.g., glass epoxy, paper phenol, aramid epoxy etc.

According to the above-mentioned methods of this invention, it is possible to obtain a conductive paste compound for via hole filling which has low viscosity and low volatility. Also, a double sided printed circuit board and a multilayer printed circuit board can be formed easily which have excellent reliability containing inner-via-hole connections. Here, the inner-via-hole connection is a method of obtaining connection between layers of the double sided and multilayer printed circuit board at any optional position.

BRIEF DESCRIPTION OF THE DRAWINGS

FIGS. 3(a) and (b) are cross-sectional views showing a method of manufacturing a multilayer printed circuit board of an embodiment of this invention.

FIGS. 4(a) and (b) are cross-sectional views showing a method of manufacturing a multilayer printed circuit board of another embodiment of this invention.

DETAILED DESCRIPTION OF THE INVENTION

This invention will be described by referring to the following illustrative examples and attached figures. In particular, the following embodiments refer to a double sided printed circuit board with use of a conductive paste for via hole filling, a method of manufacturing the same, and a multilayer printed circuit board with use thereof.

Figure 1:
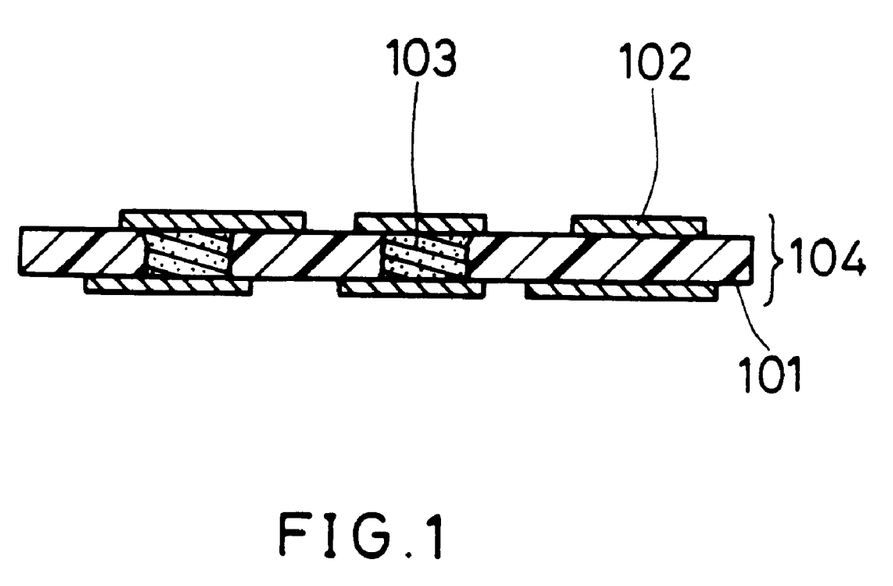
FIG. 1 is a cross-sectional view showing a structure of a double sided printed circuit board of an embodiment of this invention.

FIG. 1 is a cross-sectional view showing a structure of a double sided printed circuit board of an embodiment of this invention. A double sided printed circuit board 104 comprises a laminated base material 101, a copper foil 102 (In FIG. 1, a copper foil is formed into a circuit pattern), and a conductive via hole 103 in which a conductive paste has hardened. The major advantages of this invention are that a conductive paste compound can easily fill due to its low viscosity and low volatility, and that the substrate has excellent reliability since the connection is achieved by filling with a large amount of conductive filler. As laminated base material 101, it is possible to use laminated base materials which are widely known at present. Examples are a glass-epoxy base material, an aramid-epoxy base material, and a paper phenol base material. The base material is called "prepreg" before being heated and pressurized and comprises a glass cloth or a nonwoven fabric as a core material which is impregnated with an uncured resin.

Figure 5:
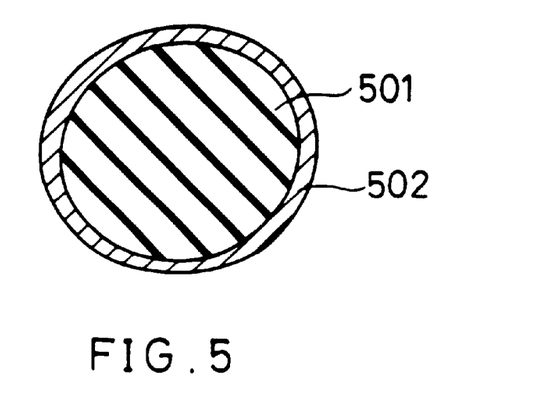
FIG. 5 is a schematic view of a conductive particle used for a printed circuit board of an embodiment of this invention.

As for the conductive filler, almost any kind of noble metals such as gold and silver or base metals such as copper, tin, nickel or lead can be used. In addition, not only pure metals can be used, but also alloyed metals or those comprising a metal or an insulating core covered with a conductive material as shown in FIG. 5. In FIG. 5, 501 denotes a spherical core, and 502 denotes a conductive material which covers the core surface and serves as the conductive filler.

Figure 2:
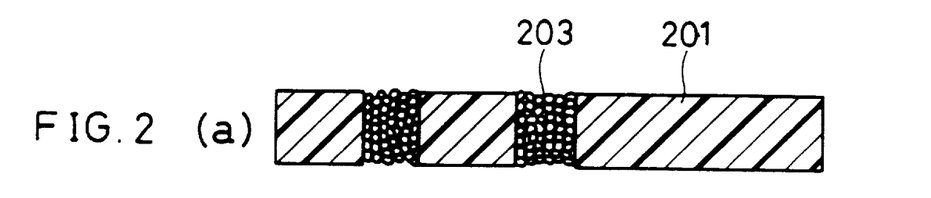
FIGS. 2(a)–(d) are cross-sectional views showing a method of manufacturing a double sided printed circuit board of an embodiment of this invention.

FIGS. 2(a) to (d) are views showing a method of manufacturing a double sided printed circuit board of this invention. In FIG. 2, a laminated base material 201 is a prepreg. This prepreg is disposed with through-holes. Usually, a drill is used for this step, but a laser beam can be used for processing specific materials. FIG. 2(b) shows a state in which FIG. 2(a) is positioned between a copper foil 202. FIG. 2(c) shows a state after FIG. 2(b) is heated and pressurized. FIG. 2(c) shows a state in which the through-holes disposed in the prepreg have an increased amount of metal filling after being heated and pressurized. Due to compression, the prepreg has become thinner and the resin has hardened. The conductive paste 203 remains compressed. Conductor 103 of this state serves for an electrical connection between the upper and lower sides. FIG. 2(d) shows a state after copper foil 202 on the surface is processed (e.g., etched) into circuit patterns. Copper foil 102 becomes a circuit conductor after being processed. After that, printed circuit boards which are actually used must be processed further, for example, applied with a solder resist, printed with letters and signs, or disposed with holes for insert components.

FIGS. 3(a) and (b) show a method of manufacturing a multilayer printed circuit board by repeatedly applying the above-mentioned method of manufacturing a double sided printed circuit board. FIG. 3(a) shows a state in which a double sided circuit board 104 which serves as a core is positioned between substrates of FIG. 2(a) having through-holes filled with conductive paste on both side (upper and lower sides) to which are further applied copper foil 202. When heated and pressurized from the upper and lower sides in this state, a multilayer printed circuit board of FIG. 3(b) is obtained which has already established an inner-via-hole connection. When the copper foils on the upper and lower sides are patterned, a multilayer printed circuit board consisting of four layers is completed. After that, by repeating these steps, a multilayer printed circuit board with even more layers can be attained.

Figure 3:
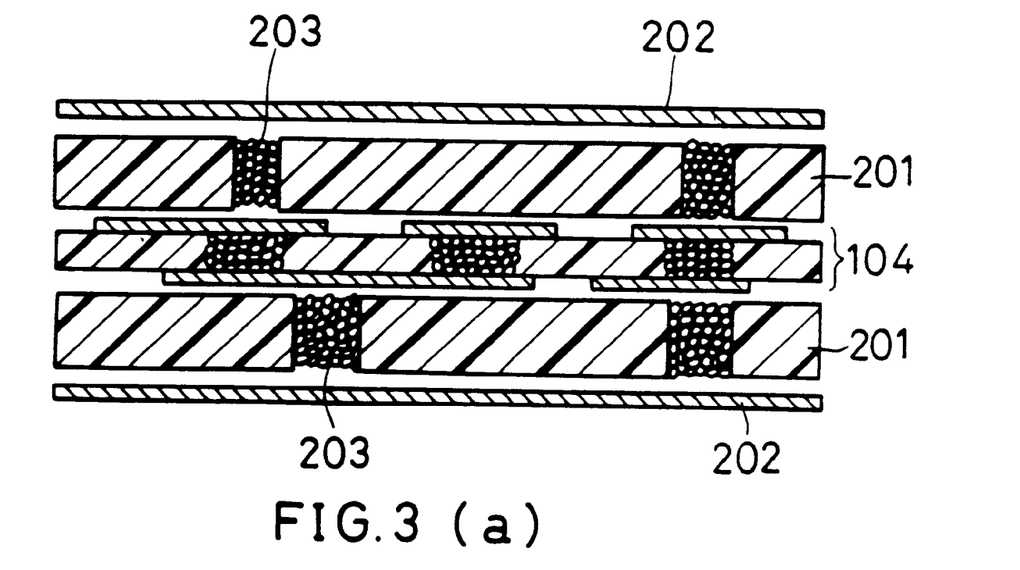

In the method of manufacturing the multilayer printed circuit board of FIG. 3, the double sided printed circuit board used for the core was the double sided printed circuit board of this invention. However, this is not necessarily the case here. Instead, it is clear that a conventional through-hole double sided printed circuit board can be applied as well. In this case, it is better to fill the through-holes in advance. Here, the through-hole substrate indicates a resin substrate, and not only can the through-hole substrate be used but also a ceramic substrate etc.

FIGS. 4(a) and (b) show another method of manufacturing a multilayer printed circuit board. In FIG. 4(a), a prepreg 201 which is filled with conductive paste 203 and is in the state before being heated and pressurized is positioned between two sheets of double sided printed circuit boards 104. When heated and pressurized in this state, a multilayer printed circuit board consisting of four layers of FIG. 4(b) can be obtained. Not only a four-layer circuit board, but a multilayer printed circuit board consisting of more layers can be obtained by providing a plurality of double sided printed circuit boards, positioning the above-noted laminated substrates which is filled with a conductive filler and is in a state before being heated and pressurized between the double sided printed circuit boards, and heating and pressurizing.

Figure 4:
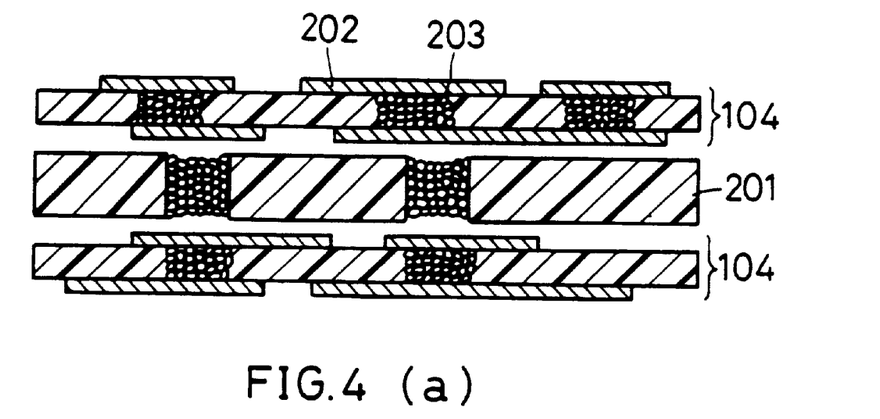

In the method of manufacturing the multilayer printed circuit board of FIG. 4, the double sided printed circuit board used was a double sided printed circuit board of this invention. However, this is not necessarily the case. Instead, a conventional through-hole double sided printed circuit board can be applied as well. In addition, not only can the through-hole substrate be used but also a ceramic substrate etc.

Epoxy resins used in the following embodiments are indicated below.

(1) bisphenol A-type epoxy resin (EPICOAT 828 manufactured by Yuka Shell Epoxy Co., Ltd., epoxy equivalent 184~194 g/eq)

(2) bisphenol F-type epoxy resin (EPICOAT 807 manufactured by Yuka Shell Epoxy Co., Ltd., epoxy equivalent 160~175 g/eq)

(3) alicyclic epoxy resin (ST-1000 manufactured by Tohto Kasei Co., Ltd., epoxy equivalent 200~220 g/eq)

(4) amine-type epoxy resin (ELN-125 manufactured by Sumitomo Chemical Co., Ltd., epoxy equivalent 110~130 g/eq)

(5) epoxy resin composed of glycidyl esterificated dimer acids (epoxy equivalent 390~470 g/eq). This resin is also called glycidyl ester type epoxy resin in these embodiments. This formula is shown as Formula 1 shown below.

FORMULA 1

EXAMPLE 1

In a first embodiment of this invention shown in FIG. 1, a prepreg was an aramid epoxy sheet (TA-01 manufactured by Teijin Ltd.) of 200 μm in thickness. This prepreg was applied on one side with a 20 μm thick polyethylene terephthalate film by an adhesive and was disposed with through-holes of 0.2 mm in diameter by a drill.

These through-holes were filled with via hole filling paste comprising a metal particle of silver, gold, copper, and nickel in a spherical and flake form at 85 weight percent, a resin composition of bisphenol A-type epoxy resin (EPICOAT 828 manufactured by Yuka Shell Epoxy Co., Ltd.) at 3 weight %, an epoxy resin composed of glycidyl esterificated dimer acids (YD-171 manufactured by Tohto Kasei Co., Ltd.) at 9 weight %, and a hardener of amine adduct hardener (MY-24 manufactured by Ajinomoto Co., Ltd.) at 3 weight %. They were mixed and kneaded in three roles. Table 1 shows the form of the metal particle, the average size of the particle, the specific surface area, and the viscosity of the via hole filling paste at 0.5 rpm in an E-type viscometer at room temperature.

TABLE 1

| Example | Powder | Form | Average size of particle μm | Specific surface area m²/g | Paste viscosity Pa · sec | Via resistance × $10^{-5}$ Ω cm |
|---|---|---|---|---|---|---|
| *1 | silver | spherical | 0.2 | 3.14 | 2,300 | 6.3 |
| 2 | | | 0.5 | 1.35 | 1,050 | 1.2 |
| 3 | | | 1.0 | 0.62 | 620 | 0.3 |
| 4 | | | 2.0 | 0.30 | 480 | 0.3 |
| 5 | | | 5.0 | 0.16 | 320 | 0.4 |
| 6 | | | 10.0 | 0.10 | 100 | 0.6 |
| 7 | | flake | 20.0 | 0.13 | 120 | 1.5 |
| *8 | | | 30.0 | 0.07 | 40 | 9.3 |
| 9 | gold | spherical | 2.0 | 0.40 | 650 | 0.3 |
| 10 | copper | spherical | 1.0 | 0.66 | 870 | 0.5 |
| 11 | | | 2.0 | 0.35 | 500 | 0.4 |

TABLE 1-continued

| Example | Powder | Form | Average size of particle μm | Specific surface area m²/g | Paste viscosity Pa · sec | Via resistance × $10^{-5}$ Ω cm |
|---|---|---|---|---|---|---|
| 12 | | | 3.0 | 0.26 | 350 | 0.4 |
| 13 | | flake | 10.0 | 0.20 | 400 | 1.5 |
| 14 | nickel | flake | 5.0 | 0.32 | 680 | 2.7 |

*a comparative example

The prepreg filled with the paste was applied with copper foil 102 of 30 μm thick on the upper and the lower sides. Then, this was formed into a double sided copper applied plate by heating and pressurizing 60 minutes at a temperature of 180° C. and 50 Kg/cm² by heat-pressing.

When the paste viscosity was 2,000 Pa.sec or more, the filling in via holes was difficult to conduct due to high viscosity.

The double sided copper applied plate formed in this manner was formed into electrode patterns by using a conventional etching technique.

Table 1 shows the resistance value of the inner-via-hole-connection conducted by using the respective paste. In all cases, a low resistance connection was obtained in which the resistivity value was ten times or less of the specific resistance value of the conductor although the paste included an insulating resin. The specific resistance value of each metal is silver ($1.6 \times 10^{-6}$ Ωcm), gold ($2.3 \times 10^{-6}$ Ωcm), and nickel ($6.8 \times 10^{-6}$ Ωcm).

EXAMPLE 2

As in the first embodiment, the prepreg of a second embodiment had through-holes formed with 0.2 mm in diameter, and these through-holes were filled with conductive paste comprising a metal particle of copper powder with an average particle size of 2 μm at 85 weight %, a resin selected from bisphenol A-type epoxy resin (EPICOAT 828 manufactured by Yuka Shell Epoxy Co., Ltd.), bisphenol F-type epoxy resin (EPICOAT 807 manufactured by Yuka Shell Epoxy Co., Ltd.), alicyclic epoxy resin (ST-1000 manufactured by Tohto Kasei Co., Ltd.), amine-type epoxy resin (ELN-125 manufactured by Sumitomo Chemical Co., Ltd.), and epoxy resin composed of glycidyl esterificated dimer acids at 12 weight %, a hardener of amine adduct hardener (PN-23 manufactured by Ajinomoto Co., Ltd.) at 3 weight %. They were mixed and kneaded in three roles. Table 2 shows the viscosity of the via hole filling paste at room temperature, the decrease of the paste weight when heated to 300° C. at a rate of 10° C./min., and the volatile amount. In all cases, the volatile amount was 2 weight % or less, and there was no swelling found during the substrate formation.

TABLE 2

| Example | Resin | Paste viscoscity Pa · sec | Volatile amount WT % | Via resistance × $10^{-5}$ Ω cm |
|---|---|---|---|---|
| 1 | bisphenol A-type | 1,500 | 0.16 | 0.4 |
| 2 | bisphenol F-type | 800 | 0.15 | 0.4 |
| 3 | alicyclic epoxy | 200 | 0.30 | 0.7 |
| 4 | amine-type epoxy | 60 | 0.30 | 0.6 |
| 5 | glycidyl ester type | 80 | 0.40 | 0.4 |

The prepreg having holes was filled with the paste and foil 102 was applied on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 2 shows the resistance value of the inner-via-hole-connection conducted by using the respective paste. In all cases, a low resistance connection was obtained in which the resistivity value was ten times or less of the specific resistance value of the conductor although the paste included an insulating resin.

Figure 6:
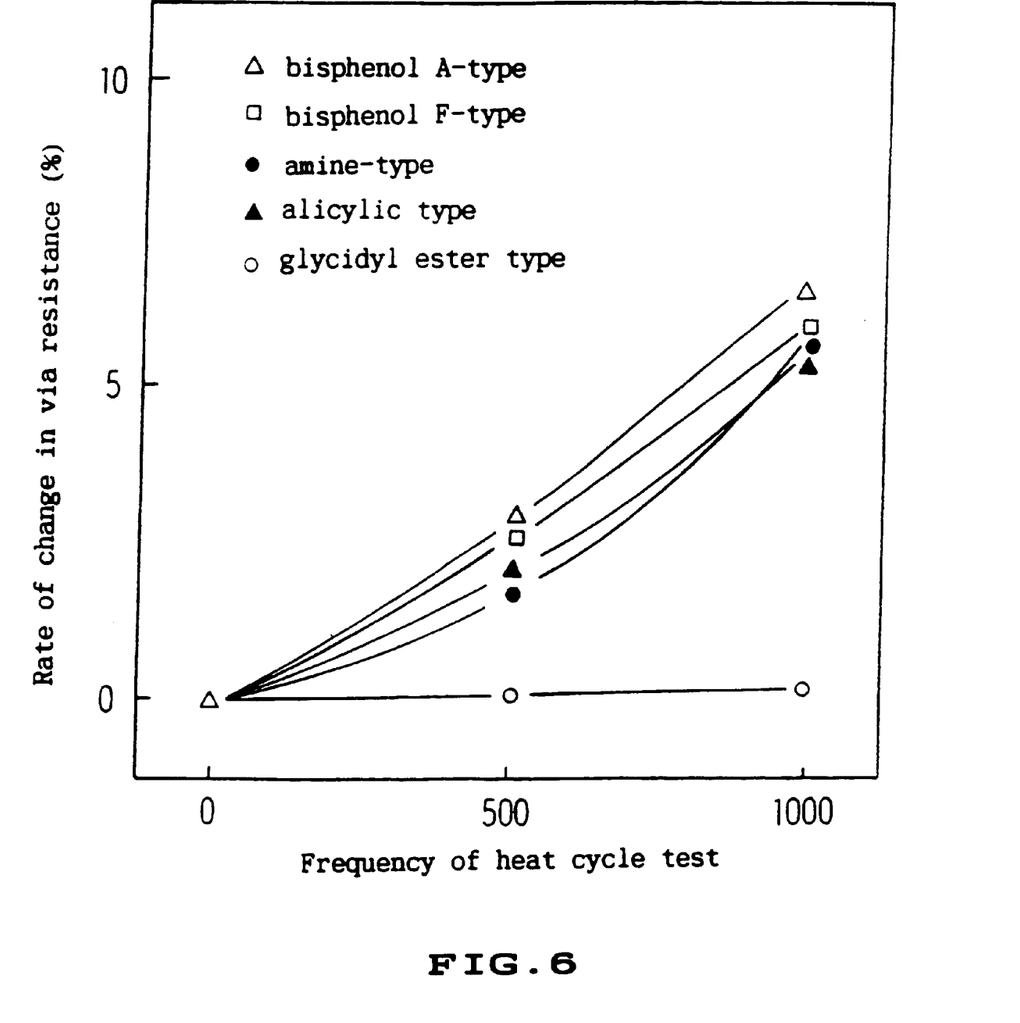
FIG. 6 is a graph showing the relationship between the change of via hole connection resistance value in a heat cycle test and the frequency of the test in an embodiment of this invention, in which the via hole connection is achieved with paste containing each epoxy resin in a printed circuit board.

Furthermore, FIG. 6 shows the change of the via hole connection resistance value in a heat cycle test (−55° C.~125° C. 30 minutes each) up to 1000 cycles.

The change of the via hole resistance value in each paste sample was 10 percent or less against the initial resistance value, so the reliability of the via hole was not ruined. In particular, the glycidyl ester type showed a rate of change at 1% or less. Due to the flexibility of the resin, only a slight change occurred against a thermal shock, and the reliability of the via-hole-connection was extremely good.

EXAMPLE 3

As in the first embodiment, the prepreg of a third embodiment had through-holes formed with 0.2 mm in diameter, and these through-holes were filled with conductive paste comprising a metal particle of copper powder with an average particle size of 2 μm at 85 weight %, a blended resin consisting of Group A (bisphenol A-type epoxy resin, bisphenol F-type epoxy resin) and Group B (alicyclic epoxy resin, amine-type epoxy resin, or epoxy resin composed of glycidyl esterificated dimer acids) at 12 gross weight %, and a hardener of amine adduct hardener (MY-24) at 3 weight %. They were mixed and kneaded in three roles. Table 3 shows the viscosity of the via hole filling paste of 0.5 rpm in an E-type viscometer at room temperature.

TABLE 3

| Example | Resin A | WT % | Resin B | WT % | Paste viscosity Pa · sec | Via resistance × $10^{-5}$ Ω cm |
|---|---|---|---|---|---|---|
| 1 | bisphenol | 50 | alicyclic | 50 | 720 | 0.8 |
| 2 | A-type | 50 | amine-type | 50 | 540 | 0.6 |
| 3 | | 75 | glycidyl | 25 | 1,060 | 0.5 |
| 5 | | 50 | ester | 50 | 660 | 0.5 |
| 6 | | 25 | | 75 | 380 | 0.4 |
| 7 | bisphenol | 75 | glycidyl | 25 | 620 | 0.5 |
| 9 | F-type | 50 | ester | 50 | 400 | 0.4 |
| 10 | | 25 | | 75 | 220 | 0.4 |

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 3 shows the resistance value of the inner-via-hole-connection conducted by using the respective paste. In all cases, a low resistance connection was obtained in which the resistivity value was ten times or less of the specific resistance value of the conductor although the paste included an insulating resin.

Figure 7:
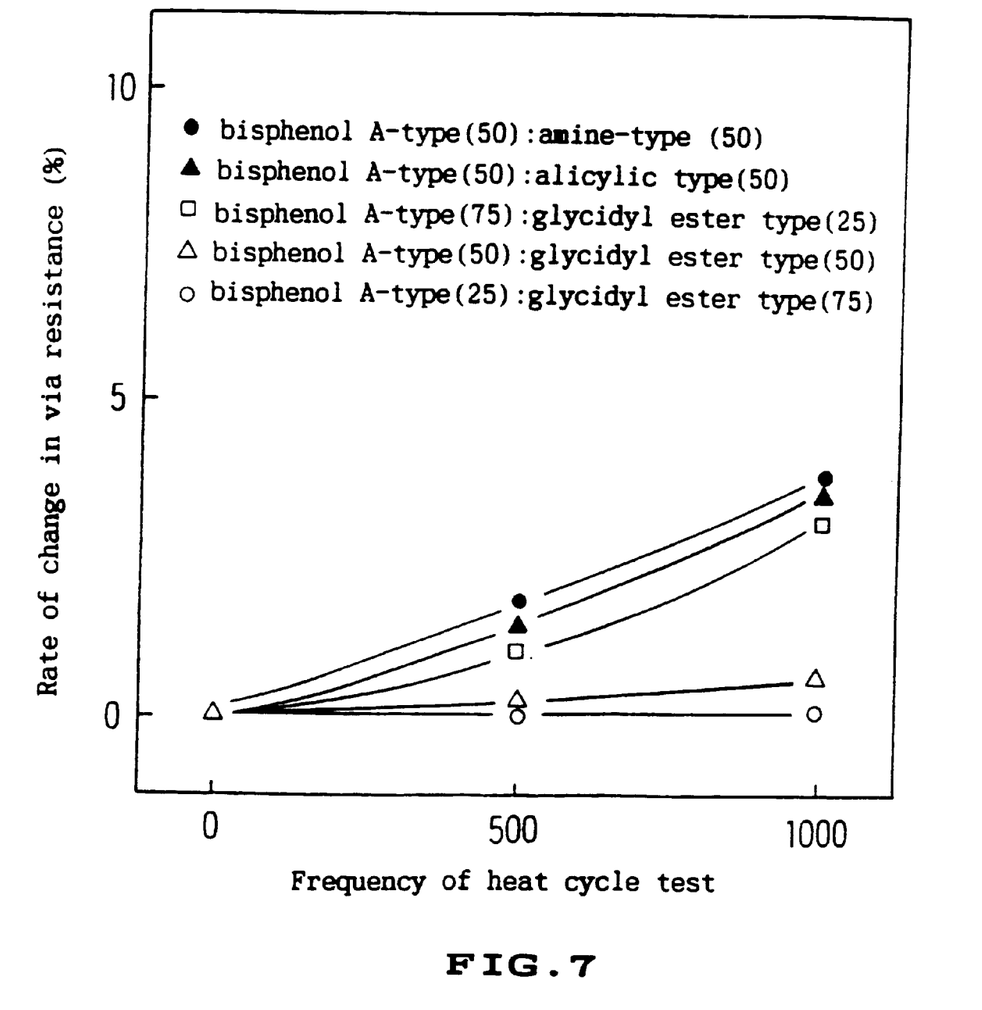
FIG. 7 is a graph showing the relationship between the change of via hole connection resistance value in a heat cycle test and the frequency of the test in an embodiment of this invention, in which the via hole connection is achieved with paste containing epoxy resin with different mixing compositions in a printed circuit board.

Furthermore, FIG. 7 shows the change of the via hole resistance value in a heat cycle test (−55° C.~125° C., 30 minutes each) up to 1000 cycles.

The change of the via hole resistance value in each paste sample was 10 percent or less against the initial resistance value, so the reliability of the via hole was not ruined. In particular, the glycidyl ester mixed type showed a rate of change at 1% or less at the amount content of 50 weight % or more, thereby maintaining the reliability of the via-hole-connection.

EXAMPLE 4

As in the first embodiment, the prepreg of a fourth embodiment had through-holes formed with 0.2 mm in diameter, and these through-holes were filled with conductive paste comprising a metal particle of silver powder or copper powder with an average particle size of 2 μm at 75 to 92.5 weight %, a blended resin consisting of bisphenol A-type epoxy resin and epoxy resin composed of glycidyl esterificated dimer acids in 25 to 75 weight ratio at 4.5 to 22 gross weight %, and a hardener of amine adduct hardener (MY-24) at 3 weight %. They were mixed and kneaded in three roles. Table 4 shows the viscosity of the via hole filling paste room temperature.

TABLE 4

| Example | Metal weight | WT % | Resin | WT % | Paste viscosity Pa · sec | Via resistance × $10^{-5}$ Ω cm |
|---|---|---|---|---|---|---|
| 1 | silver | 80.0 | bisphenol A | 17 | 250 | 0.7 |
| 2 | | 85.0 | (25 WT %) + glycidyl ester (75 WT %) | 12 | 480 | 0.4 |
| *3 | copper | 75.0 | bisphenol A | 22 | 40 | 4.8 |
| 4 | | 80.0 | (25 WT %) + | 17 | 180 | 0.8 |
| 5 | | 85.0 | glycidyl ester | 12 | 380 | 0.4 |
| 6 | | 90.0 | (75 WT %) | 7 | 890 | 0.4 |
| 7 | | 92.0 | | 5 | 1,450 | 0.3 |
| *8 | | 92.5 | | 4.5 | 2,310 | 0.3 |

*a comparative example

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 4 shows the resistance value of the inner-via-hole-connection conducted by using the respective paste. In all cases, a low resistance connection was obtained in which the resistivity value was ten times or less of the specific resistance value of the conductor although the paste included an insulating resin. On the other hand, when the metallic amount content was 80 weight % or less, the via hole resistance value was large due to the lack of the conductive metal. Furthermore, when the metallic amount content was 92 weight % or more, the via hole filling was difficult to conduct due to high paste viscosity.

EXAMPLE 5

As in the first embodiment, the prepreg of a fifth embodiment had through-holes formed with 0.2 mm in diameter, and these through-holes were filled with conductive paste comprising a metal particle of silver powder or copper powder with an average particle size of 2 μm at 85 weight %, a blended resin consisting of bisphenol A-type epoxy resin and epoxy resin composed of glycidyl esterificated dimer acids in 25 to 75 weight ratio at 12 gross weight %, and dicyandiamide (DICY7 manufactured by Yuka Shell Epoxy Co., Ltd.) or acid anhydride (RIKACID MH manufactured by New Japan Chemical Co., Ltd.) or amine adduct hardener (PN-23, MY-24 manufactured by Ajinomoto Co., Ltd.) at 3 weight %. They were mixed and kneaded in three roles. Table 5 shows the viscosity of the via hole filling paste at room temperature and the volatile amount of the paste when heated to 300° C. at a rate of 10° C./min.

TABLE 5

| Example | Metal | Hardener | Paste viscosity Pa · sec | Volatile amount WT % | Via resistance × $10^{-5}$ Ω cm |
|---|---|---|---|---|---|
| 1 | silver | dicyandiamide | 520 | 0.32 | 0.4 |
| 2 | | acid anhydride | 200 | 1.50 | 0.5 |
| 3 | | amine adduct (MY-24) | 620 | 0.50 | 0.4 |
| 4 | | amine adduct (PN-23) | 600 | 0.42 | 0.4 |
| 5 | copper | dicyandiamide | 380 | 0.35 | 0.4 |
| 6 | | acid anhydride | 120 | 1.56 | 0.5 |
| 7 | | amine adduct (MY-24) | 430 | 0.50 | 0.4 |
| 8 | | amine adduct (PN-23) | 450 | 0.40 | 0.4 |

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 5 shows the resistance value of the inner-via-hole-connection conducted by using the respective paste. Regardless of the hardener type, a low resistance connection was obtained in which the resistivity value was ten times or less of the specific resistance value of the conductor although the paste included an insulating resin.

EXAMPLE 6

As in the first embodiment, the prepreg of a sixth embodiment had through-holes formed with 0.2 mm in diameter, and these through-holes were filled with conductive paste comprising a metal particle of copper powder with an average particle size of 2 μm at 85 weight %, a blended resin consisting of bisphenol A-type epoxy resin and epoxy resin composed of glycidyl esterificated dimer acids in 25 to 75 weight ratio at 8 to 14.5 gross weight %, and phthalic anhydride or amine adduct type hardener (MY-24) at 0.5 to 7 weight %. They were mixed and kneaded and mixed in three roles. Table 6 shows the viscosity of the via hole filling paste at room temperature and the volatile amount of the paste when heated to 300° C. at a rate of 10° C./min.

TABLE 6

| Example | Hardener | Amount of hardener WT % | Paste viscosity Pa · sec | Volatile amount WT % | Via resistance × $10^{-5}$ Ω cm |
|---|---|---|---|---|---|
| 1 | acid | 0.5 | 160 | 0.60 | 0.8 |
| 2 | anhydride | 3.0 | 120 | 1.56 | 0.5 |
| 3 | | 5.0 | 120 | 1.95 | 0.4 |
| *4 | | 7.0 | 110 | 2.34 | — |
| 5 | amine | 0.5 | 180 | 0.40 | 0.4 |
| 6 | adduct | 3.0 | 450 | 0.40 | 0.4 |
| 7 | | 5.0 | 850 | 0.38 | 0.5 |
| *8 | | 7.0 | 2,400 | 0.35 | 20.0 |

*a comparative example

The prepreg filled with this paste was applied with copper foil 102 on the upper and the lower sides. Then, this was. formed into a double sided copper applied plate by heating and pressurizing 60 minutes at 180° C. and 50 Kg/cm² by heat-pressing. Electrode patterns were formed by using a conventional etching technique.

Table 6 shows the resistance value of the inner-via-hole-connection conducted by using the respective paste. Regardless of the hardener type, a low resistance connection was obtained in which the resistivity value was ten times or less of the specific resistance value of the conductor although the paste included an insulating resin. However, when too much solid powder such as an amine adduct hardener was added, the viscosity increased, so the via hole filling was difficult to conduct by using the paste added with a hardener of 5 weight % or more. Furthermore, when a hardener with high volatility such as acid anhydride had a volatile amount of more than 2 weight %, a double sided copper applied plate of satisfactory quality was not obtained due to swelling of the substrate and the electrode.

EXAMPLE 7

As in the first embodiment, the prepreg of a seventh embodiment had through-holes formed with 0.2 mm in diameter, and these through-holes were filled with conductive paste comprising a metal particle of copper powder with an average particle size of 2 μm having different surface oxygen amounts at 85 weight %, a blended resin consisting of bisphenol A-type epoxy resin and epoxy resin composed of glycidyl esterificated dimer acids in 25 to 75 weight ratio at 12 gross weight %, and a hardener of amine adduct hardener (MY-24) at 3 weight %. They were mixed and kneaded in three roles. Table 7 shows the viscosity of the via hole filling paste at room temperature.

TABLE 7

| Example | Surface oxygen amount WT % | Paste viscosity Pa · sec | Via resistance × $10^{-5}$ Ω cm |
|---|---|---|---|
| 1 | 0.2 | 430 | 0.3 |
| 2 | 0.5 | 450 | 0.4 |
| 3 | 1.0 | 500 | 0.8 |
| *4 | 1.2 | 680 | 2.5 |

*a comparative example

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 7 shows the resistance value of the inner-via-hole-connection conducted by using the respective paste. When using paste with the surface oxygen concentration of copper at 1.0 weight % or less, a low resistance connection was obtained in which the resistivity value was ten times or less of the specific resistance value of the conductor although the paste included an insulating resin. However, along with the increase in the surface oxygen concentration, the resistance of the inner-via-hole connection became higher. As soon as this amount exceeded 1.0 weight %, the resistance value increased radically. As a result, a low resistance connection was not obtained in which the resistivity value was ten times or less of the specific resistance value of the conductor.

EXAMPLE 8

The conductive paste used here comprised a metal particle of copper powder with an average particle size of 2 μm at 85 weight %, a blended resin consisting of bisphenol A-type epoxy resin and epoxy resin composed of glycidyl esterificated dimer acids in 25 to 75 weight ratio at 12 gross weight %, and a hardener of amine adduct hardener (MY-24) at 3 weight % which had been kneaded and mixed in three roles. An aramid-epoxy prepreg comprised a prepreg disposed with through-holes of 0.2 mm in diameter which were filled with the above-mentioned paste. This aramid-epoxy prepreg was positioned between two sheets of aramid-epoxy double sided substrates having patterns formed for the connection resistance measurement. Then, this was formed into a four-layer printed circuit board by heating and pressurizing 60 minutes at 180° C. and 50 Kg/cm² by heat-pressing.

The inner-via-hole connection resistance formed between the second and the third layer of the four-layer substrate showed the same resistance value as in the first embodiment. Also, a six-layer printed circuit board attained the same reliability with the same connection resistance value as in the four-layer printed circuit board.

Furthermore, the above-mentioned paste was used for manufacturing an aramid-epoxy double sided substrate with the same method as in Example 1. One sheet of this substrate was positioned between two sheets of aramid-epoxy prepregs comprising prepregs having through-holes of 0.2 mm in diameter filled with the above-noted paste. In the method of forming a four-layer printed circuit board by heating and pressurizing 60 minutes at 180° C. and 50 Kg/cm² by heat-pressing, equivalent resistance was obtained for the via-hole-connection. In addition, the same reliability was obtained in a six-layer printed circuit board manufactured by using this method.

tured by Teijin Ltd.) of 200 μm in thickness. This prepreg was applied on one side with a 20 μm thick polyethylene terephthalate film by an adhesive and was disposed with through-holes of 0.2 mm in diameter by a drill.

These through-holes were filled with via hole filling paste comprising a metal particle of silver, gold, copper and nickel in a spherical and flake form at 85 weight %, a resin composition of bisphenol A-type epoxy resin (EPICOAT 828 manufactured by Yuka Shell Epoxy Co., Ltd.) at 3 weight %, an epoxy resin composed of glycidyl esterificated dimer acids (YD-171 manufactured by Tohto Kasei Co., Ltd.) at 9 weight %, a hardener of amine adduct hardener (MY-24 manufactured by Ajinomoto Co., Ltd.) at 3 weight %, and a dispersant at 0.01 to 2.0 weight % against the gross amount of the metal, the resin, and the hardener comprising polyoxyethylene sorbitan fatty acid ester (nonionic surface active agent "SOLGEN" TW manufactured by Dai-ichi Kogyo Seiyaku Co., Ltd.), phosphate (anion surface active agent "PLYSURF" manufactured by Dai-ichi Kogyo Seiyaku Co., Ltd.), and cation surface active agent "CATIO-GEN" (manufactured by Dai-ichi Kogyo Seiyaku Co., Ltd.). They were mixed and kneaded in three roles. Table 8 shows the form of the metal particle, the average size of the particle, the specific surface area, the type of the dispersant and its compounded amount (weight %), and the viscosity of the via hole filling paste of 0.5 rpm in an E-type viscometer at room temperature.

TABLE 8

| Example | Powder | Form | Average size of particle μm | Specific surface area m²/g | Dispersant | Compounded amount at weight % | Paste viscosity Pa · sec | Via resistance × $10^{-5}$ Ω cm |
|---|---|---|---|---|---|---|---|---|
| *1 | silver | spherical | 0.1 | 5.83 | PLYSURF | 0.20 | 2,350 | 4.7 |
| 2 | | | 0.2 | 3.14 | | | 1,620 | 1.2 |
| 3 | | | 0.5 | 1.35 | | | 850 | 0.4 |
| 4 | | | 1.0 | 0.62 | | | 480 | 0.3 |
| 5 | | | 2.0 | 0.30 | | | 390 | 0.3 |
| 6 | | | 5.0 | 0.16 | | | 270 | 0.4 |
| 7 | | | 10.0 | 0.10 | | | 80 | 0.6 |
| 8 | | flake | 20.0 | 0.13 | | | 90 | 1.3 |
| *9 | | | 30.0 | 0.07 | | | 30 | 10.3 |
| 10 | gold | spherical | 2.0 | 0.40 | | | 470 | 0.3 |
| 11 | copper | spherical | 1.0 | 0.66 | | | 820 | 0.5 |
| *12 | | | 2.0 | 0.35 | | 0 | 500 | 0.4 |
| 13 | | | | | | 0.01 | 470 | 0.4 |
| 14 | | | | | | 0.20 | 420 | 0.4 |
| 15 | | | | | | 0.50 | 410 | 0.5 |
| 16 | | | | | | 1.50 | 380 | 0.8 |
| *17 | | | | | | 2.00 | 350 | 2.3 |
| 18 | | | | | SOLGEN TW | 0.20 | 450 | 0.4 |
| 19 | | | | | CATIOGEN | 0.20 | 460 | 0.4 |
| 20 | | | 3.0 | 0.26 | PLYSURF | 0.20 | 300 | 0.4 |
| 21 | | flake | 10.0 | 0.20 | | | 370 | 1.5 |
| 22 | nickel | flake | 5.0 | 0.32 | | | 610 | 2.0 |

*a comparative example

A ceramic substrate with circuits was used instead of the aramic-epoxy double sided substrate manufactured by the same method as in Example 1, and the same reliability was obtained for the via-hole-connection resistance.

EXAMPLE 9

In a ninth embodiment of this invention shown in FIG. 1, the prepreg was an aramid-epoxy sheet (TA-01 manufac- The prepreg filled with the paste was applied with copper foil 102 of 35 μm thick on the upper and the lower sides. Then, this was formed into a double sided copper applied plate by heating and pressurizing 60 minutes at 180° C. and 50 Kg/cm² by heat-pressing.

When the paste viscosity was 2,000 Pa.sec or more, which is beyond the limits of claims of this invention, the filling into via holes was difficult to conduct due to high viscosity.

The double sided copper applied plate formed in this manner was formed into electrode patterns by using a conventional etching technique.

Table 8 shows the resistance value of the inner-via-hole-connection conducted by using the respective paste. In all cases, a low resistance connection was obtained in which the resistivity value was ten times or less of the specific resistance value of the conductor although the paste included an insulating resin. The specific resistance value of each metal used in this embodiment is silver ($1.6 \times 10^{-6}$ Ωcm), gold ($2.3 \times 10^{-6}$ Ωcm), copper ($1.7 \times 10^{-6}$ Ωcm), and nickel ($6.8 \times 10^6$ Ωcm).

Figure 8:
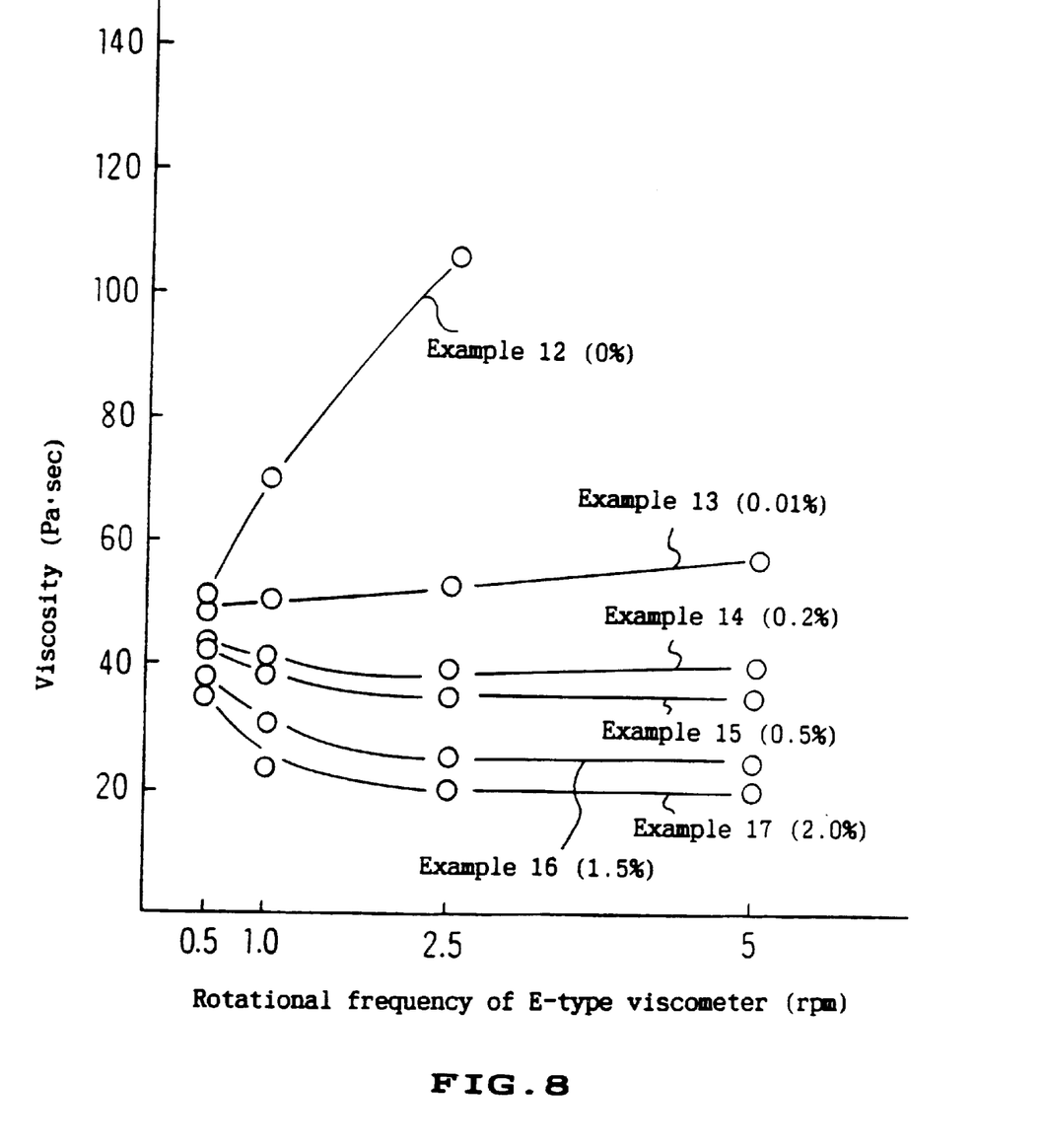
FIG. 8 is a graph showing the relationship between the rotational frequency (shear) in an E-type viscometer and the viscosity of paste which includes a dispersant in different amounts.

Furthermore, the change of the paste viscosity is shown in FIG. 8 in which shear is provided to the paste by changing the frequency with an E-type viscometer. It is desirable as filling paste that the viscosity decreases under high shear in a printing process rather than under the condition of no shear. The examples without dispersant added increased the viscosity when provided with shear, so it was difficult to fill the paste. On the other hand, the examples with dispersant added made a small increase in the viscosity under high shear, and for those added more than 0.5 weight part decreased the viscosity under high shear. Accordingly, the filling became easier to conduct. However, the examples with dispersant added 2.0 weight % or more had the connection of the metal particles disturbed, so the via connection resistance increased.

EXAMPLE 10

As in the ninth embodiment, the prepreg of a tenth embodiment had through-holes formed with 0.2 mm in diameter, and these through-holes were filled with conductive paste comprising a metal particle of copper powder with an average size of 2 μm at 85 weight %, a resin selected from bisphenol A-type epoxy resin, bisphenol F-type epoxy resin (EPICOAT 807 manufactured by Yuka Shell Epoxy Co., Ltd.), alicyclic epoxy resin (ST-1000 manufactured by Tohto Kasei Co., Ltd.), amine type epoxy resin (ELN-125 manufactured by Sumitomo Chemical Co., Ltd.), and an epoxy resin composed of glycidyl esterificated dimer acids at 12 weight %, a hardener of amine adduct hardener (PN-23 manufactured by Ajinomoto Co., Ltd.) at 3 weight %, and a dispersant of phosphate ("PLYSURF" manufactured by Dai-ichi Kogyo Seiyaku Co., Ltd.) contained at 0.2 weight % against the gross amount of the metal, the resin, and the hardener. They were mixed and kneaded in three roles. Table 9 shows the viscosity of the via hole filling paste at room temperature and the decrease or the volatile amount of the paste when heated to 300° C. at a rate of 10° C./min. In all cases, the volatile amount of the paste was 2 weight % or less, and there was no swelling found during the substrate manufacturing process.

TABLE 9

| Example | Resin | Paste viscosity Pa · sec | Volatile amount WT % | Via resistance × $10^{-5}$ Ω cm |
|---|---|---|---|---|
| 1 | bisphenol A-type | 1,350 | 0.16 | 0.4 |
| 2 | bisphenol F-type | 720 | 0.15 | 0.4 |
| 3 | alicyclic epoxy | 180 | 0.30 | 0.8 |
| 4 | amine-type epoxy | 50 | 0.30 | 0.6 |
| 5 | glycidyl ester type | 60 | 0.40 | 0.6 |

The prepreg having holes was filled with the paste and applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 9 shows the resistance value of the inner-via-hole-connection conducted by using the respective paste. In all cases, a low resistance connection was obtained in which the resistivity value was ten times or less of the specific resistance value of the conductor although the paste included an insulating resin.

EXAMPLE 11

As in the eighth embodiment, the prepreg of an eleventh embodiment had through-holes formed with 0.2 mm in diameter, and these through-holes were filled with conductive paste comprising a metal particle of copper powder with an average particle size of 2 μm at 85 weight %, a blended resin consisting of Group A (bisphenol A-type epoxy resin, bisphenol F-type epoxy resin) and Group B (alicylic epoxy resin, amine-type epoxy resin, epoxy resin composed of glycidyl esterificated dimer acids) at 12 gross weight %, a hardener of amine adduct hardener (MY-24) at 3 weight %, and a dispersant of phosphate ("PLYSURF" manufactured by Dai-ichi Kogyo Seiyaku Co., Ltd.) at 0.2 weight % against the gross amount of the metal, the resin, and the hardener. They were mixed and kneaded in three roles. An aramid-epoxy prepreg comprised a prepreg disposed with through-holes of 0.2 mm in diameter which were filled with the above-mentioned paste. Table 10 shows the viscosity of the via hole filling paste of 0.5 rpm in an E-type viscometer at room temperature.

TABLE 10

| Example | Resin A | WT % | Resin B | WT % | Paste viscosity Pa · sec | Via resistance × $10^{-5}$ Ω cm |
|---|---|---|---|---|---|---|
| 1 | bisphenol A-type | 50 | alicyclic | 50 | 650 | 0.8 |
| 2 | A-type | 50 | amine-type | 50 | 460 | 0.5 |
| 3 |  | 75 | glycidyl | 25 | 870 | 0.5 |
| 5 |  | 50 | ester | 50 | 600 | 0.6 |
| 6 |  | 25 |  | 75 | 340 | 0.5 |
| 7 | bisphenol | 75 | glycidyl | 25 | 570 | 0.5 |
| 9 | F-type | 50 | ester | 50 | 380 | 0.4 |
| 10 |  | 25 |  | 75 | 200 | 0.5 |

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 10 shows the resistance value of the inner-via-hole-connection conducted by using the respective paste. A low resistance connection was obtained in which the resistivity value was ten times or less of the specific resistance value of the conductor although the paste included an insulating resin.

EXAMPLE 12

As in the eighth embodiment, the prepreg of a twelfth embodiment had through-holes formed with 0.2 mm in diameter, and these through-holes were filled with conductive paste comprising a metal particle of silver powder or copper powder with an average particle size of 2 μm at 75 to 92.5 weight %, a blended resin consisting of bisphenol A-type epoxy resin and epoxy resin composed of glycidyl esterificated dimer acids in 25 to 75 weight ratio at 4.5 to 22 gross weight %, a hardener of amine adduct hardener (MY-24) at 3 weight %, and a dispersant containing phosphate ("PLYSURF" manufactured by Dai-ichi Kogyo Seiyaku Co., Ltd.) at 0.2 weight % against the gross amount of the metal, the resin, and the hardener. They were mixed and kneaded in three roles. Table 11 shows the viscosity of the via hole filling paste at room temperature.

TABLE 11

| Example | Metal weight | WT % | Resin | WT % | Paste viscosity Pa · sec | Via resistance × $10^{-5}$ Ω cm |
|---|---|---|---|---|---|---|
| 1 | silver | 80.0 | bisphenol A | 17 | 250 | 0.7 |
| 2 | | 85.0 | (25 WT %) + | 12 | 480 | 0.4 |
| | | | glycidyl ester | | | |
| | | | (75 WT %) | | | |
| *3 | copper | 75.0 | bisphenol A | 22 | 40 | 5.0 |
| 4 | | 80.0 | (25 WT %) + | 17 | 180 | 0.7 |
| 5 | | 85.0 | glycidyl ester | 12 | 380 | 0.4 |
| 6 | | 90.0 | (75 WT %) | 7 | 890 | 0.4 |
| 7 | | 92.0 | | 5 | 1,450 | 0.3 |
| 8 | | 92.5 | | 4.5 | 1,880 | 0.4 |
| *9 | | 93.0 | | 4 | 2,680 | — |

*a comparative example

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 11 shows the resistance value of the inner-via-hole-connection conducted by using the respective paste. A low resistance connection was obtained in which the resistivity value was ten times or less of the specific resistance value of the conductor although the paste included an insulating resin. However, in the compositions beyond the limits of claims of this invention, when the metallic amount content was 80 weight % or less, the via hole resistance value was large due to the lack of the conductive metal. Furthermore, when the metallic amount content was 92 weight % or more, the via hole filling was difficult to conduct due to high paste viscosity.

EXAMPLE 13

As in the eighth embodiment, the prepreg of a thirteenth embodiment had through-holes formed with 0.2 mm in diameter, and these through-holes were filled with conductive paste comprising a metal particle of silver powder or copper powder with an average particle size of 2 μm at 85 weight %, a blended resin consisting of bisphenol A-type epoxy resin and epoxy resin composed of glycidyl esterificated dimer acids in 25 to 75 weight ratio at 12 gross weight %, a hardener of dicyandiamide (DICY7 manufactured by Yuka Shell Epoxy Co., Ltd.) or acid anhydride (RIKACID MH manufactured by New Japan Chemical Co., Ltd.) or amine adduct hardener (PN-23, MY-24 manufactured by Ajinomoto Co., Ltd.) at 3 weight %, and a dispersant containing phosphate ("PLYSURF" manufactured by Dai-ichi Kogyo Seiyaku Co., Ltd.) at 0.2 weight % against the gross amount of the metal, the resin, and the hardener. They were mixed and kneaded in three roles. Table 12 shows the viscosity of the via hole filling paste at room temperature (25° C.) and the volatile amount of the paste when heated to 300° C. at a rate of 10° C./min.

TABLE 12

| Example | Metal | Hardener | Paste viscosity Pa · sec | Volatile amount WT % | Via resistance × $10^{-5}$ Ω cm |
|---|---|---|---|---|---|
| 1 | silver | dicyandiamide | 470 | 0.32 | 0.4 |
| 2 | | acid anhydride | 180 | 1.50 | 0.4 |
| 3 | | amine adduct (MY-24) | 540 | 0.50 | 0.4 |
| 4 | | amine adduct (PN-23) | 520 | 0.42 | 0.4 |
| 5 | copper | dicyandiamide | 320 | 0.35 | 0.4 |
| 6 | | acid anhydride | 100 | 1.56 | 0.5 |
| 7 | | amine adduct (MY-24) | 380 | 0.50 | 0.4 |
| 8 | | amine adduct (PN-23) | 380 | 0.40 | 0.4 |

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 12 shows the resistance value of the inner-via-hole-connection conducted by using the respective paste. Regardless of the hardener type, a low resistance connection was obtained in which the resistivity value was ten times or less of the specific resistance value of the conductor although the paste included an insulating resin.

EXAMPLE 14

As in the eighth embodiment, the prepreg of a fourteenth embodiment had through-holes formed with 0.2 mm in diameter, and these through-holes were filled with conductive paste comprising a metal particle of silver powder or copper powder with an average particle size of 2 μm at 85 weight %, a blended resin consisting of bisphenol A-type epoxy resin and epoxy resin composed of glycidyl esterificated dimer acids in 25 to 75 weight ratio at 8 to 14.5 gross weight %, a hardener of phthalic anhydride or amine adduct hardener (MY-24) at 0.5 to 7 weight %, and a dispersant containing phosphate ("PLYSURF" manufactured by Dai-ichi Kogyo Seiyaku Co., Ltd.) at 0.2 weight % against the gross amount of the metal, the resin, and the hardener. They were mixed and kneaded in three roles. Table 13 shows the viscosity of the via hole filling paste at room temperature and the volatile amount of the paste when heated to 300° C. at a rate of 10° C./min.

TABLE 13

| Example | Hardener | Amount of hardener WT % | Paste viscosity Pa · sec | Volatile amount WT % | Via resistance × $10^{-5}$ Ω cm |
|---|---|---|---|---|---|
| 1 | acid | 0.5 | 140 | 0.60 | 0.9 |
| 2 | anhydride | 3.0 | 100 | 1.58 | 0.5 |
| 3 | | 5.0 | 110 | 1.95 | 0.4 |
| *4 | | 7.0 | 110 | 2.34 | — |
| 5 | amine | 0.5 | 170 | 0.40 | 0.5 |
| 6 | adduct | 3.0 | 410 | 0.40 | 0.5 |
| 7 | | 5.0 | 720 | 0.38 | 0.5 |
| *8 | | 7.0 | 2,100 | 0.35 | 15.0 |

*a comparative example

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 13 shows the resistance value of the inner-via-hole-connection conducted by using the respective paste. Regardless of the weight ratio of the hardener, a low resistance connection was obtained in which the resistivity value was ten times or less of the specific resistance value of the conductor although the paste included an insulating resin. However, when too much solid powder such as an amine adduct hardener was added, the viscosity increased, so the via hole filling was difficult to conduct by using the paste added with a hardener of 5 weight % or more. Furthermore, when a hardener with high volatility such as acid anhydride had a volatile amount of more than 2 weight %, a double sided copper applied plate of satisfactory quality was not obtained due to swelling of the substrate and the electrode.

EXAMPLE 15

As in the eighth embodiment, the prepreg of a fifteenth embodiment had through-holes formed with 0.2 mm in diameter, and these through-holes were filled with conductive paste comprising a metal particle of copper powder with an average particle size of 2 μm having different surface oxygen amounts at 85 weight %, a blended resin consisting of bisphenol A-type epoxy resin and epoxy resin composed of glycidyl esterificated dimer acids in 25 to 75 weight ratio at 12 gross weight %, a hardener of amine adduct hardener (MY-24) at 3 weight %, and a dispersant containing phosphate ("PLYSURF" manufactured by Dai-ichi Kogyo Seiyaku Co., Ltd.) at 0.2 weight % against the gross amount of the metal, the resin, and the hardener. They were mixed and kneaded in three roles. Table 14 shows the viscosity of the via hole filling paste at room temperature.

TABLE 14

| Example | Surface oxygen amount WT % | Paste viscosity Pa · sec | Via resistance × 10⁻⁵ Ω cm |
|---|---|---|---|
| 1 | 0.2 | 400 | 0.3 |
| 2 | 0.5 | 410 | 0.3 |
| 3 | 1.0 | 430 | 0.5 |
| *4 | 1.2 | 580 | 2.5 |

*a comparative example

The prepreg filled with this paste was applied with copper foil 102 on the upper and the lower sides. Then, this was formed into a double sided copper applied plate by heating and pressurizing 60 minutes at 180° C. and 50 Kg/cm² by heat-pressing. Electrode patterns were formed by using a conventional etching technique.

Table 14 shows the resistance value of the inner-via-hole-connection conducted by using the respective paste. When using paste with the surface oxygen concentration of copper at 1.0 weight % or less, a low resistance connection was obtained in which he resistivity value was ten times or less of the specific resistance value of the conductor although the paste included an insulating resin. However, along with the increase in the surface oxygen concentration, the resistance of the inner-via-hole connection became higher. As soon as this amount exceeded 1.0 weight %, the resistance value increased radically. As a result, a low resistance connection was not obtained in which the resistivity value was ten times or less of the specific resistance value of the conductor.

EXAMPLE 16

Conductive paste used here comprised a metal particle of copper powder with an average particle size of 2 μm at 85 weight %, a blended resin consisting of bisphenol A-type epoxy resin and epoxy resin composed of glycidyl esterificated dimer acids in 25 to 75 weight ratio at 12 gross weight %, a hardener of amine adduct hardener (MY-24) at 3 weight %, and a dispersant containing phosphate ("PLYSURF" manufactured by Dai-ichi Kogyo Seiyaku Co., Ltd.) at 0.2 weight % against the gross amount of the metal, the resin, and the hardener. They were mixed and kneaded in three roles. An aramid-epoxy prepreg comprised a prepreg disposed with through-holes of 0.2 mm diameter which were filled with the above-mentioned paste. This aramid-epoxy prepreg was positioned between two sheets of aramid-epoxy double sided substrates having patterns formed for the connection resistance measurement. Then, this was formed into a four-layer printed circuit board by heating and pressurizing 60 minutes at 180° C. and 50 Kg/cm² by heat-pressing.

The inner-via-hole connection resistance formed between the second and the third layer of the four-layer substrate showed the same resistance value as in the first embodiment. Also, a six-layer printed circuit board attained the same reliability with the same connection resistance value as in the four-layer printed circuit board.

Furthermore, the above-mentioned paste was used for manufacturing an aramid-epoxy double sided substrate with the same method as in Example 8. One sheet of this substrate was positioned between two sheets of aramid-epoxy prepregs comprising prepregs having through-holes of 0.2 mm in diameter filled with the above-noted paste. In the method of forming a four-layer printed circuit board by heating and pressurizing 60 minutes at 180° C. and 50 Kg/cm² by heat-pressing, equivalent resistance was obtained for the via-hole-connection. In addition, the same reliability was obtained in a six-layer printed circuit board manufactured by using this method.

A ceramic substrate with circuits was used instead of the aramic-epoxy double sided substrate manufactured by the same method as in Example 8, and the same reliability was obtained for the via-hole-connection resistance.

As described above, according to a double sided printed circuit board, a multilayer printed circuit board, and methods of manufacturing the same with use of the via hole filling paste of this invention, a double sided printed circuit board with inner via holes can be attained without using a through-hole plating technique. Furthermore, this circuit board can be formed into a multilayer printed circuit board easily.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A multilayer printed circuit board comprising a plurality of insulating base material layers and two or more electrode layers, wherein each insulating base material is disposed with inner via holes filled with a conductive resin compound comprising a conductive filler in an amount of 80 to 92 weight percent having an average particle size of 0.5 to 20 μm and a specific surface area of 0.1 to 1.5 m²/g, and an epoxy resin which comprises glycidyl esterified dimer acids in an amount of 4.5 to 20 weight percent, wherein each electrode layer is electrically connected through contact with the conductive resin compound.

2. The multilayer printed circuit board as in claim 1, wherein said insulating base material comprises a composite material of an aramid fiber and a thermosetting resin.

3. The multilayer printed circuit board as in claim 1, wherein said insulating base material comprises a composite material of an aramid nonwoven fabric and an epoxy resin.

4. The multilayer printed circuit board as claimed in claim 1, wherein said epoxy resin contains 10 weight percent or more of an epoxy resin which comprises glycidyl esterified dimer acids.

* * * * *